United States Patent
Ghoshal et al.

(10) Patent No.: US 9,373,771 B2
(45) Date of Patent: Jun. 21, 2016

(54) ENHANCED METAL-CORE THERMOELECTRIC COOLING AND POWER GENERATION DEVICE

(75) Inventors: Uttam Ghoshal, Austin, TX (US); Ayan Guha, Austin, TX (US); James Borak, Dale, TX (US)

(73) Assignee: SHEETAK INC., Austin, TX (US)

(*) Notice: Subject to any disclaimer, the term of this patent is extended or adjusted under 35 U.S.C. 154(b) by 946 days.

(21) Appl. No.: 12/998,536

(22) PCT Filed: Nov. 27, 2009

(86) PCT No.: PCT/US2009/006298
§ 371 (c)(1),
(2), (4) Date: Apr. 29, 2011

(87) PCT Pub. No.: WO2010/065082
PCT Pub. Date: Jun. 10, 2010

(65) Prior Publication Data
US 2011/0220164 A1    Sep. 15, 2011

Related U.S. Application Data

(60) Provisional application No. 61/200,802, filed on Dec. 4, 2008.

(51) Int. Cl.
*H01L 35/02* (2006.01)
*H01L 35/30* (2006.01)
*H01L 35/32* (2006.01)
*C04B 35/547* (2006.01)
*H01L 35/34* (2006.01)

(52) U.S. Cl.
CPC .............. *H01L 35/32* (2013.01); *C04B 35/547* (2013.01); *H01L 35/34* (2013.01); *C04B 2235/40* (2013.01); *C04B 2235/408* (2013.01)

(58) Field of Classification Search
CPC .. H01L 35/04; H01L 35/20; G01K 7/01–7/14
USPC .................................................. 136/205, 255
See application file for complete search history.

(56) References Cited

U.S. PATENT DOCUMENTS 6,492,585 B1 * 12/2002 Zamboni et al. ............... 136/201
2007/0261730 A1 * 11/2007 Seker et al. .................... 136/224

\* cited by examiner

*Primary Examiner* — Marla D McConnell
*Assistant Examiner* — Dujuan Horton
(74) *Attorney, Agent, or Firm* — Strasburger & Price, LLP

(57) ABSTRACT

In various embodiments of the present invention, a thermoelectric device is provided. The thermoelectric device includes one or more thermoelements that transfer heat across the ends of the thermoelectric device. A method for creating the thermoelectric device includes forming a metal substrate, and etching one or more surfaces of the metal substrate to form etched portions. The unetched flat portions on the metal substrate are referred to as mesa cores. Thereafter, thermoelectric films are deposited on the one or more surfaces of the metal substrate. The deposition of the thermoelectric films on the mesa cores results in the formation of a thermoelement.

11 Claims, 10 Drawing Sheets

ENHANCED METAL-CORE THERMOELECTRIC COOLING AND POWER GENERATION DEVICE

BACKGROUND

The present invention relates generally to the field of thermoelectric devices. More specifically, the present invention relates to thin film thermoelectric devices and methods of manufacturing such devices.

Thermoelectric devices are solid-state devices that convert thermal energy into electrical energy in the presence of a temperature gradient. While the conversion of temperature difference into electricity is due to the Seebeck effect, an inverse reciprocal effect that enables the transfer of heat when electrical energy is provided is known as the Peltier effect. Therefore, a thermoelectric cooling device (also known as a Peltier device) is a solid state heat pump, which transfers heat from one location to another in the presence of an electrical current. In the reciprocal power generation mode, a thermoelectric device can generate electricity if a temperature gradient is applied across it. Thermoelectric devices have tremendous potential in providing eco-friendly solutions to energy and cooling requirements.

Conventional thermoelectric cooling devices use one or more thermoelectric couples in conjunction with a power source for cooling purposes. Typically, such cooling devices have a low cooling density due to their poor material properties, large form factors and soldered interfaces at the cooling boundaries. The cooling power of a thermoelectric cooler is proportional to the power factor P, ($P=S^2\sigma$, where S is the Seebeck coefficient and $\sigma$ is the electrical conductivity). In addition, the cooling power of the thermoelectric cooler is inversely proportional to the transport length l. Conventional thermoelectric cooling devices have a long transport length (~1-3 mm) and low maximum cooling power (~5 W/cm$^2$). Ideally, a good thermoelectric material should have a large Seebeck coefficient and high electrical conductivity to minimize Joule heating. Additionally, it should have low thermal conductivity to maintain large temperature gradients. These criteria help to define the thermoelectric figure of merit, Z ($Z=S^2\sigma/\lambda$, where S is the Seebeck coefficient of material, $\sigma$ is the electrical conductivity, and $\lambda$ is the thermal conductivity of the material).

Another parameter for evaluating the performance of thermoelectric materials is a dimensionless quantity defined as ZT. Since the discovery of semiconductors as useful thermoelectric materials in the early 1950s, a large number of materials have been investigated in an attempt to increase the parameter ZT. Among the materials discovered, compound semiconductors, based on Bismuth Telluride (ZT close to 1), are best suited as thermoelectric materials for room temperature applications. Recent breakthroughs in super-lattice and nano-structured materials have resulted in getting high values for ZT, but these are yet to be incorporated in commercial coolers. One of the methods for increasing the ZT of these compound semiconductors involves depositing thin films under suitable conditions. Thin film deposition enables optimization of the relevant parameters. This optimization can be achieved by sequentially growing different thin films of different materials without contaminating the interfaces. Thin film deposition also uses less thermoelectric materials than those used in conventional film deposition, thereby reducing the cost of the thermoelectric devices. Thin film deposition provides flexibility to the process of manufacturing vertical or lateral thermoelectric coolers. Further, lateral thermoelectric coolers are suitable for high cooling densities. Due to short transport lengths, thin film thermoelectric cooling devices have a fast time response, making them suitable for polymerase chain reaction (PCR) and transient cooling applications.

Therefore, thin film thermoelectric cooling devices are more economical, reliable and efficient, as compared to conventional thermoelectric cooling devices. Since the cooling power of the thermoelectric cooler is inversely proportional to the transport length of the cooling elements, thin film thermoelectric elements are suitable for high cooling densities (>100 W/cm$^2$). Removal of a large amount of heat from the cold side of the thermoelectric cooler results in the dissipation of large densities of heat (>200 W/cm$^2$) on the hot side of the thermoelectric cooler. The inability of the thermoelectric cooler to spread or transport heat from the hot side significantly limits the performance of thin film thermoelectric cooling devices. Managing such large densities of heat is the foremost challenge in realizing the true potential of thin film thermoelectric cooling devices.

In the past decade, rapid progress in the field of semiconductor device manufacturing has resulted in a large number of thin film thermoelectric cooling devices being implemented on Silicon (Si) or Gallium Arsenide (GaAs) substrates. However, the ease of processing thermoelectric materials by using standard techniques in the deposition of films on semiconductor substrates is offset by the fact that these films do not spread heat adequately when formed using standard techniques. The process of patterning and etching thermoelectric films usually contaminates the surfaces that are crucial for the performance of these thin film thermoelectric cooling devices. To manage heat densities by using fans and heat sinks for air cooling, it is necessary to fabricate a thin film thermoelectric cooling device with thick thermoelectric legs. Etching thick thermoelectric films consumes a considerable amount of time, involves prolonged exposure to chemicals, and degrades the properties of the films. Since different types of films etch differently, it is difficult, if not impossible, to etch a compound stack of thermoelectric films. Optimization of a thermoelectric film by changing its composition or type requires a new etching process. The restrictions imposed by etching significantly limit the process of material development and incorporation of novel films for the enhanced performance of these thin film thermoelectric cooling devices. The integration steps of etching, patterning, and the like, also result in an increase in the contact resistance and packaging complexity of the thin film thermoelectric cooling devices.

Consequently, there is a need to create a process that incorporates the advantages of thin film thermoelectric materials and also addresses their current drawbacks.

SUMMARY

In an embodiment of the present invention, a thermoelectric device is provided. A method for creating the thermoelectric device includes forming a metal substrate, and etching one or more surfaces of the metal substrate to form one or more etched portions on the metal substrate. One or more flat portions that remain on the metal substrate are hereinafter referred to as mesa cores. Thermoelectric films, preferably thin thermoelectric films, are then deposited on the one or more surfaces of the metal substrate. Further, a thin layer of barrier elements, such as aluminum, tungsten, Titanium Tungsten (TiW), and gold, is deposited on the thermoelectric films. The deposition of the thermoelectric film on both surfaces of the metal substrate results in the formation of a dual mesa core thermoelement. The thermoelectric film can be either p type thermoelectric film (excess holes) or n type thermoelectric film (excess electrons), depending on the majority carriers in the film. While a single doped target is usually employed for sputtering or PVD deposition of p type thermoelectric film, the elementary targets can be used to co-sputter an n type thermoelectric film on the metal substrate.

The thermoelectric device includes one or more thermoelements, usually by alternating a p-type element and an n-type element such that the p-type element and the n-type element are connected by metallic interconnects. In the presence of a DC electrical current, these thermoelements transfer heat across the two ends of the thermoelectric device. In the present invention, each thermoelement includes a metal substrate, which facilitates the dissipation of the extracted heat and the joule heat from a cold side of the thermoelectric device to a heat sink located at a hot side of the thermoelectric device. Since the thermoelectric film is directly deposited on the metal substrate, both the electrical and the thermal contact resistances are minimized. The metal substrate manages high thermal flux in the hot side by spreading the heat in a better manner than a conventional semiconductor substrate, and by providing a large surface area to minimize soldering losses.

Each thermoelement includes one or more mesa cores that are flat portions. These mesa cores define the electrical and thermal contact area of the thermoelectric film. The mesa cores have a cross section area that defines the electrical and thermal properties such as resistance of the thermoelement. The maximum current (Imax) that can enable cooling of a thermoelectric element is defined as $I_{max}=ST_c/R$, where S is the Seebeck coefficient, $T_c$ the temperature of the cold side, and R the electrical resistance. The surface area of the one or more mesa cores controls the electrical resistance of the thermoelectric element, thereby controlling the $I_{max}$ and the operating current of an associated thermoelectric leg. A typical thermoelectric device has an $I_{max}$ that is close to five amperes. Further, the use of one or more mesa cores adjusts the thermal conductance between the top and bottom sides of the device, thereby maintaining the desired temperature difference.

In an embodiment of the present invention, only one surface of the metal substrate is etched. Thermoelectric film is then deposited on the etched surface of the metal substrate. Further, a thin layer of barrier elements, such as aluminum, tungsten, TiW, and gold, is deposited on the thermoelectric film on the etched surface of the metal substrate. Thereafter, a thin layer of barrier elements, such as tungsten, TiW and gold, is deposited on the surface of the metal substrate that is not etched.

In yet another embodiment of the present invention, a flat core thermoelement is provided. The method for forming the flat core thermoelement includes forming a metal substrate, etching the metal substrate, and forming a wafer. A graded thermoelectric material is then deposited on the wafer followed by deposition of a material that acts as electrical dielectric and thermal insulator, e.g. a polyimide material. In this embodiment, photo-definable polyimides are used. The photo-definable polyimides are cured using ultraviolet light such that regions of polyimide exposed to ultraviolet light become cross-linked and the unexposed regions are removed by dissolving them in organic solvents. A patterned polyimide layer is obtained in this manner. The wafer obtained after the polyimide deposition is electroplated with a material that acts as a conducting electrical contact, e.g. copper through the open gaps or vias. Thereafter, a solder material such as tin is electroplated on the wafer.

BRIEF DESCRIPTION OF THE DRAWINGS

The preferred embodiments of the present invention will hereinafter be described in conjunction with the appended drawings that are provided to illustrate and not to limit the invention, wherein like designations denote like elements, and in which.

DETAILED DESCRIPTION OF THE INVENTION

Figure 1:
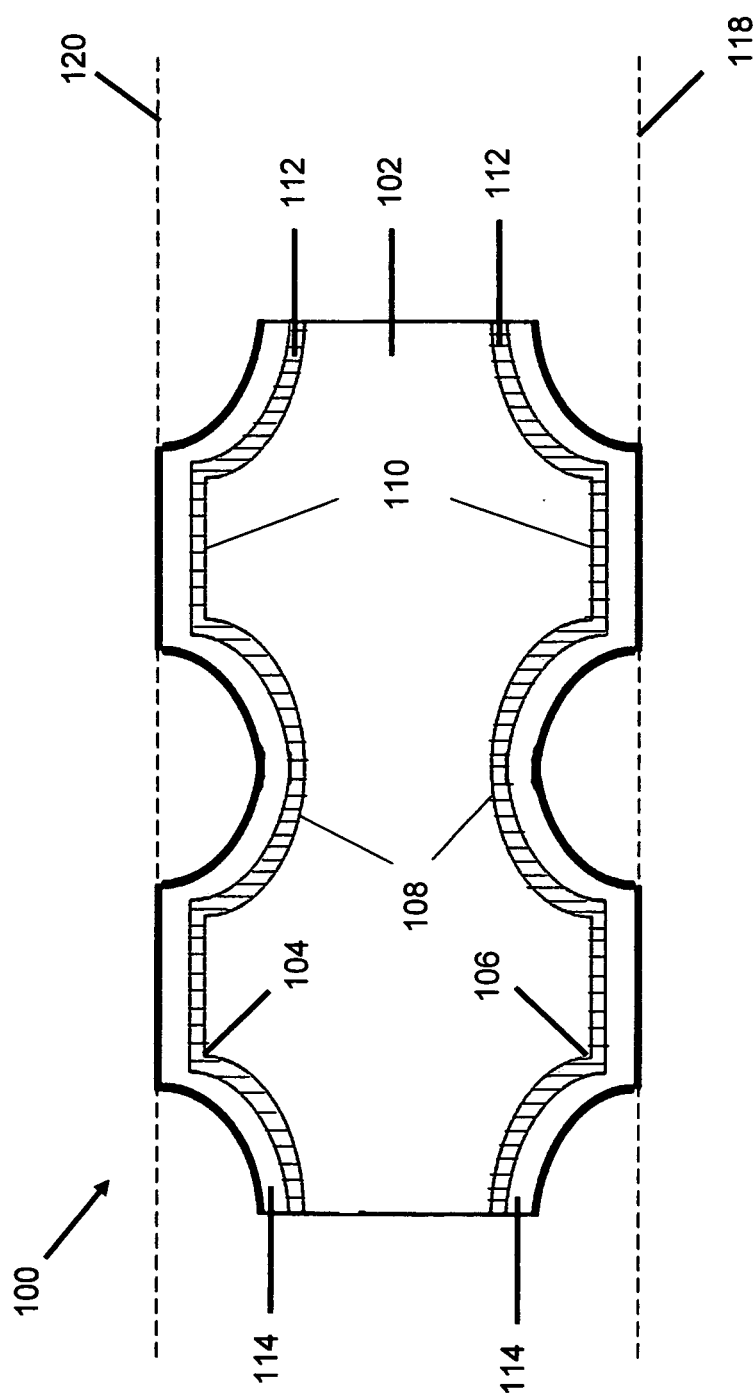
FIG. 1 illustrates a cross-sectional view of a thermoelement, in accordance with an embodiment of the present invention.

FIG. 1 illustrates a cross-sectional view of a first thermoelement 100, in accordance with an embodiment of the present invention. First thermoelement 100 includes a metal substrate 102 that contains thermoelectric film 112 and first barrier layer 114 on its major surfaces.

In accordance with an embodiment of the present invention, first thermoelement 100 includes metal substrate 102 to facilitate the dissipation of heat to a heat sink (not shown) of first thermoelement 100. In an embodiment, metal substrate 102 is made of molybdenum. In another embodiment, metal substrate 102 is made of aluminum, tungsten, nickel, chromium, copper or combinations of these metals. In an exemplary embodiment, metal substrate 102 has a cuboidal shape with two sides equal to 1 millimeter and thickness equal to 200 micrometer. The surfaces of metal substrate 102 are smooth with a roughness of less than or equal to 1 micrometer. Use of materials such as aluminum in metal substrate 102 makes first thermoelement 100 cheaper than conventional thermoelements. Conventional thermoelectric thin film cooling devices depend on semiconductor substrates on which metal interconnects are deposited. This creates a number of thermal interfaces between the thermoelectric film and the heat sink. In accordance with the exemplary embodiment of the present invention, the interfaces are reduced to a minimum to enable an efficient heat flow to the heat sink.

Metal substrate 102 includes a first surface 104 and a second surface 106. First surface 104 and second surface 106 include grooves 108 and mesa cores 110, which are flat portions of the surfaces. In an embodiment of the present invention, grooves 108 and mesa cores 110 are formed on metal substrate 102 by etching metal substrate 102. In an embodiment, grooves 108 are isotropic by nature and have the form of a circular arc having a radius of 100 micrometer. In an embodiment of the present invention, mesa cores 110 have a length of 50 micrometer. Metal substrate 102 is etched using etching methods that include chemical or photochemical etching.

First surface 104 and second surface 106 contain thermoelectric film 112 coated on them. In this embodiment, thermoelectric film 112 is an n-type semiconductor material having a thickness of less than 10 micrometer or a p-type semiconductor material having a thickness of less than 10 micrometer. For room temperature applications, preferred p-type semiconductor materials include optimal compositions of $Bi_2Te_3$—$Sb_2Te_3$ pseudo-ternary systems; $Zn_4Sb_3$: $Ag_{0.5}Pb_6Sn_{0.2}Sb_{0.2}Te_{10}$, $MnSi_{1.73}$ or $NaCo_2O_4$. Further, preferred n-type semiconductor material include optimal compositions of: $Bi_2Te_3$—$Bi_2Se_3$ pseudo-ternary systems; lead telluride (PbTe), $AgPb_{18}SbTe_2O$; indium antimonide (InSb); gallium indium antimonide (GaInSb); indium arsenide (InAs); cobalt, nickel, or iron antimonide ((Co, Ni, Fe)$Sb_3$); ytterbium aluminide ($YbAl_3$); or magnesium suicides such as $Mg_2Si_{0.4}Sn_{0.6}$. In one embodiment, thermoelectric film 112 is a sputter deposited film of a compound mentioned above. In another exemplary embodiment, thermoelectric film 112 is a silicon (Si) nanowire deposited on metal substrate 102. In accordance with an embodiment, layered thermoelectric thin films include metallic thermoelectric films with a high power factor, for example, $YbAl_3$ sandwiching a high Seebeck film, which includes materials such as bismuth telluride ($Bi_2Te_3$) and lead telluride (PbTe), In an exemplary embodiment, first thermoelement 100 may include multiple thermoelectric films deposited over metal substrate 102, thereby forming a layered structure with an engineered graded Seebeck coefficient. First thermoelement 100 that contains thermoelectric film 112 on both surfaces 104 and 106 of metal substrate 102 is called a dual core thermoelement.

When a current flows through first thermoelement 100, heat is transferred from a first end 118 to a second end 120 of first thermoelement 100. In accordance with an embodiment of the present invention, first barrier layer 114 is present on thermoelectric film 112. Typical compositions of first barrier layer 114 include, but are not limited to, aluminum (Al), titanium tungsten (TiW), nickel (Ni) and gold (Au). Gold (Au) is desirable for easy soldering to metals in the package. Aluminum or Nickel is provided in first barrier layer 114 to prevent diffusion of gold into thermoelectric film 112. In another embodiment, first barrier layer 114 includes compounds such as TiW/Ni or TiW/Pt/Au.

First thermoelement 100 includes mesa cores 110, which are flat portions that provide electrical contact to thermoelectric film 112 and control the thermal flux passing through first thermoelement 100. It should be apparent to a person skilled in the art that the thermal resistance increases when the footprint cross-section area of mesa cores 110 or the number of mesa cores 110 decreases.

Figure 2:
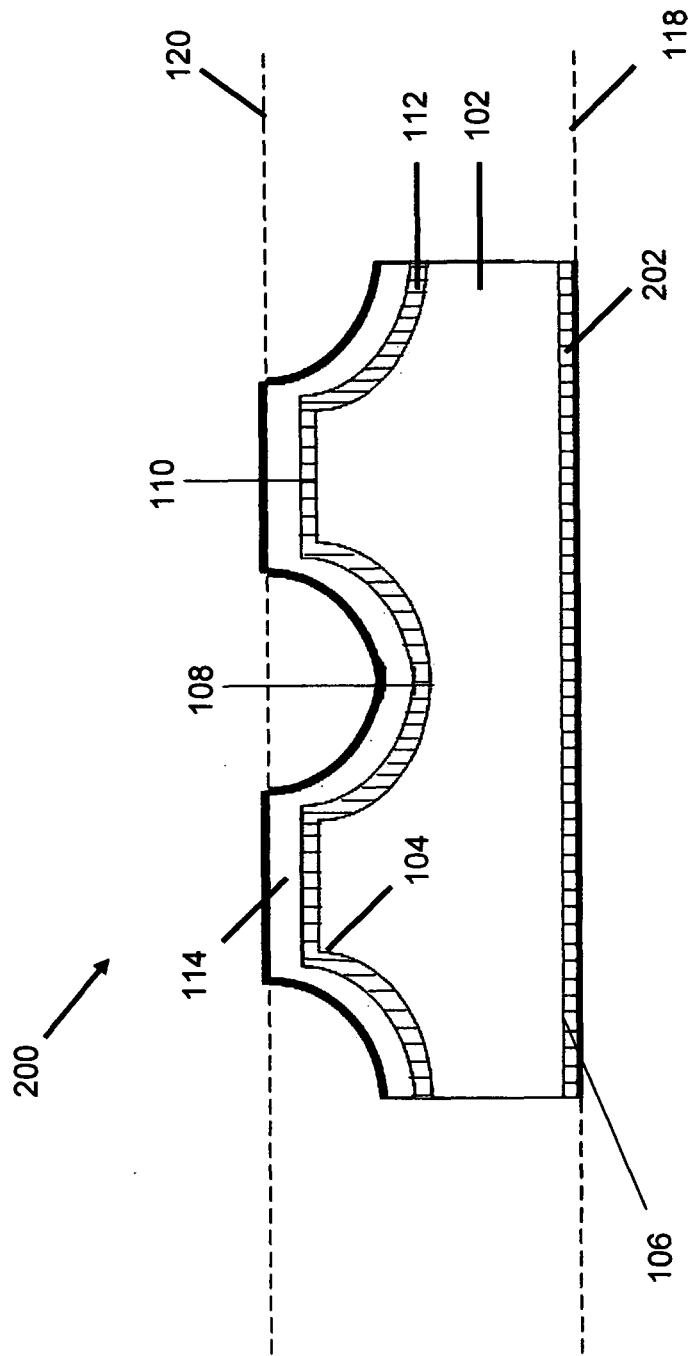
FIG. 2 illustrates a cross-sectional view of a thermoelement, in accordance with another embodiment of the present invention.

FIG. 2 illustrates a cross-sectional view of a second thermoelement 200, in accordance with another embodiment of the present invention. Second thermoelement 200 includes metal substrate 102, thermoelectric film 112, first barrier layer 114, and a second barrier layer 202.

In accordance with an embodiment of the present invention, second thermoelement 200 includes metal substrate 102 to facilitate the dissipation of heat to a heat sink (not shown) of second thermoelement 200. In an exemplary embodiment, metal substrate 102 has a cuboidal shape with two sides equal to 1 millimeter and a thickness equal to 150 micrometer. The surface of metal substrate 102 is smooth with a roughness of less than or equal to 1 micrometer. Materials that can be used to manufacture metal substrate 102 have been described in conjunction with FIG. 1.

Metal substrate 102 includes first surface 104 and second surface 106. In this embodiment of the present invention, only first surface 104 includes grooves 108 and mesa cores 110, which are flat portions. In an embodiment of the present invention, grooves 108 and mesa cores 110 are formed on metal substrate 102 by etching metal substrate 102. Metal substrate 102 is etched using etching methods that include chemical or photochemical etching. Grooves 108 are isotropic by nature and have the form of a circular arc having a radius of 100 micrometer. In an embodiment of the present invention, mesa cores 110 have a dimension of 50 micrometer.

In this embodiment of the present invention, thermoelectric film 112 is coated on first surface 104. Thermoelectric film 112 is an n-type semiconductor material having a thickness of less than 10 micrometer or a p-type semiconductor material having a thickness of less than 10 micrometer. Preferred semiconductor materials used in thermoelectric film 112 have been described in conjunction with FIG. 1. In one embodiment, thermoelectric film 112 is a sputter deposited film of a compound described in conjunction with FIG. 1. In an exemplary embodiment, second thermoelement 200 may include multiple thermoelectric films deposited over metal substrate 102, thereby forming a layered structure with an engineered graded Seebeck coefficient.

When a current flows through second thermoelement 200, heat is transferred from first end 118 to second end 120 of second thermoelement 200. In accordance with an embodiment of the present invention, first barrier layer 114 is present on thermoelectric film 112. Typical compositions of first barrier layer 114 have been described in conjunction with FIG. 1. Second barrier layer 202 is present on second surface 106 of metal substrate 102. Typical examples of second barrier layer 202 include, but are not limited to, titanium tungsten (TiW) and gold (Au).

Second thermoelement 200 includes mesa cores 110, which are flat portions that provide electrical contact to thermoelectric film 112 and control the thermal flux passing through second thermoelement 200. It should be apparent to a person skilled in the art that the thermal resistance increases when the footprint cross-section area of mesa cores 110 or the number of mesa cores 110 decreases.

Figure 3:
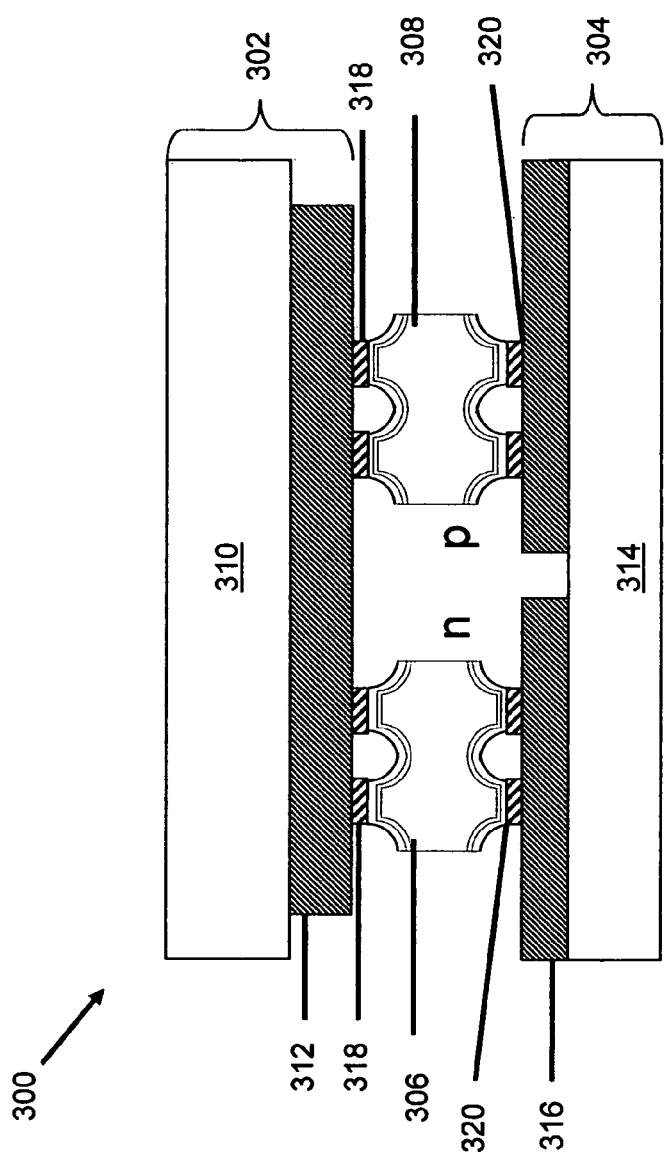
FIG. 3 illustrates a cross-sectional view of a thermoelectric cooling device, in accordance with a further embodiment of the present invention.

FIG. 3 illustrates a cross-sectional view of a first thermoelectric cooling device 300, in accordance with an embodiment of the present invention. First thermoelectric cooling device 300 includes, in addition to the elements described in reference to FIG. 1, a first part 302, a second part 304, a first n-type thermoelement 306, and a first p-type thermoelement 308.

In accordance with an embodiment of the present invention, first part 302 includes a first layer 310. First layer 310 is made of a thermally conducting but electrically insulating material, the examples of which include ceramic plate, alumina, sapphire, silicon, aluminum nitride, and diamond substrates. In another exemplary embodiment, first layer 310 is a metal-core Printed Circuit Board (PCB) with an aluminum core and anodized aluminum as the insulating layer. A typical example of the metal-core PCB is Anotherm substrate PCB. First part 302 further includes a second layer 312, which is a metallic interconnect and connects the thermoelements. In a metal-core PCB, conducting tracks made of electroplated copper (Cu), Cu/Ni/Sn or silver (Ag) form second layer 312.

In an exemplary embodiment, second layer 312 is made of elements such as copper, aluminum, silver, nickel, gold, and the like.

Second part 304 includes a third layer 314 that is functionally similar to first layer 310. Third layer 314, which is an electrical insulator but a thermal conductor, is made of one of, but not limited to, ceramic, aluminum nitride, alumina, sapphire, silicon, and artificial diamond. Like first layer 310, third layer 314 can also be a metal-core printed circuit board. Second part 304 also includes a fourth layer 316, which is a metallic interconnect with similar functionalities as second layer 312. Like second layer 312, fourth layer 316 is made of one of, but not limited to, copper, aluminum, tin, nickel, silver, and gold.

First thermoelectric cooling device 300 includes one or more thermoelements, provided between first part 302 and second part 304. For the purpose of this particular description, the one or more thermoelements are indicated by first n-type thermoelement 306 and first p-type thermoelement 308 that are dual core thermoelements. First N-type thermoelement 306 comprises n-type thermoelectric films (films with electrons as majority carriers), whereas first p-type thermoelement 308 comprises p-type thermoelectric films (films with holes as majority carriers). Alternating the p-type and n-type thermoelements is desirable to ensure that both the thermoelements cool the first part 302 and reject the heat to the second part 304, while the thermoelements remain connected electrically in series. Thermoelements 306 and 308 are attached to second layer 312 and fourth layer 316 through metal solders 318 and 320, respectively. In accordance with an embodiment, metal solders 318 and 320 are one of the common tin, tin-silver, tin-indium, tin-copper, gold-tin, bismuth-tin and lead-tin solders.

First N-type thermoelement 306 and first p-type thermoelement 308 include metal substrate 102, first barrier layer 114, and one or more thermoelectric films 112 (described in detail in conjunction with FIG. 1). In this exemplary embodiment, metal substrate 102 not only provides support to the thin thermoelectric films but also helps in the electrical as well as thermal conduction. In accordance with an embodiment, each thermoelement is coated with a solder on both ends. The thermoelements can be a replacement for thick thermoelectric legs of traditional devices. Since thermoelectric films in the thermoelements are more efficient than bulk thermoelectric legs and are economical to produce, this replacement is beneficial not only for improving the performance but also for reducing the manufacturing cost of the device. The thin film deposition enables Seebeck engineering of the layers, thereby improving the performance significantly. The thermoelectric cooling device as described in this embodiment has a quick response time, high cooling density and higher efficiency, as compared to a traditional thermoelectric device.

The use of refractory metals for metal substrates such as molybdenum (Mo) or tungsten (W) allows stability at very high temperatures that are generated during the deposition and annealing of the thermoelectric film 112. Further, use of refractory metals for metal substrates provides chemically inert behavior, very low thermal expansion at high temperatures, high thermal conductivity for spreading heat, and burr-free dicing. Aluminum substrate are lower in cost but cannot be used at high temperatures because Aluminum becomes soft and ductile at temperatures greater than 400 degrees centigrade and limits the deposition and annealing temperatures for thermoelectric film 112. Alternate metals such as Nickel and Copper/Nickel have intermediate properties as compared to molybdenum, tungsten and aluminum.

While metal substrates are extremely useful in minimizing the electrical and thermal losses, soft substrates such as Al and Cu exhibit a significant "burring" (or deformation) when diced with a diamond saw. Any burr projecting out of the substrate can interfere with the assembly of the thermoelements, and, in some cases, cause a thermal short between the top and bottom layers. While judicious choice of diamond blade and saw speed can minimize the burr height, it is almost negligible (less than a micron) when advanced dicing techniques such as laser cutting are introduced. Burring can also be eliminated by carrying out one of pre-grooving the substrates before a thin film deposition, chemically etching the edges while protecting the active area with photoresist, and creating spacers in the packaging substrate. In an exemplary embodiment, the spacers can be in the form of metallic pedestals in layers 312 and 316.

While integrated thin film thermoelectric devices on semiconductor substrates generally cannot dissipate heat efficiently, first thermoelectric cooling device 300 can provide cooling densities close to 100 watts per square centimeter and heat rejection densities close to 400 watts per square centimeter. The high cooling density is achieved by using thin thermoelectric films. Further, the thermal losses due to ineffective spreading of heat are minimized by the high thermal conductivity of the metal substrates.

Figure 4:
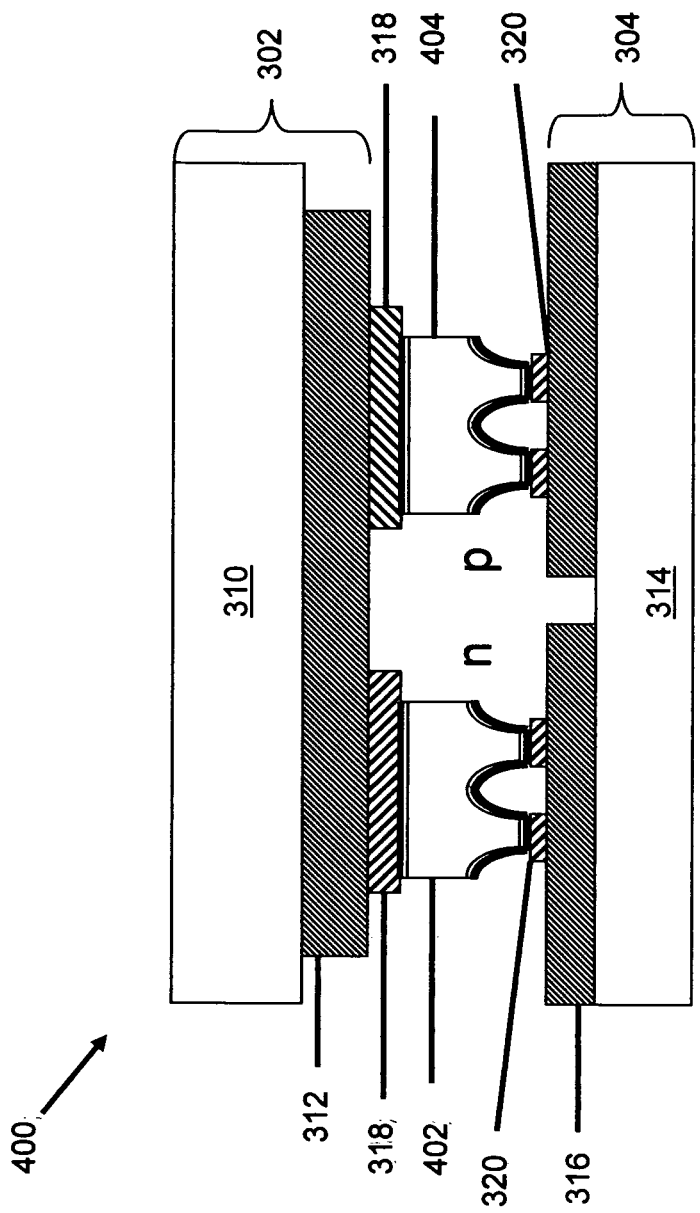
FIG. 4 illustrates a cross-sectional view of a thermoelectric cooling device, in accordance with another embodiment of the present invention.

FIG. 4 illustrates a cross-sectional view of a second thermoelectric cooling device 400, in accordance with another embodiment of the present invention. Second thermoelectric cooling device 400 includes, in addition to the elements described in reference to FIG. 1 and FIG. 3, a second n-type thermoelement 402 and a second p-type thermoelement 404.

As discussed in conjunction with FIG. 3, first part 302 includes a first layer 310. First layer 310 is made of a thermally conducting but electrically insulating material, the examples of which have been mentioned in conjunction with FIG. 3. As described in FIG. 3, first part 302 further includes second layer 312, which is a metallic interconnect and connects the thermoelements. In a metal-core PCB, conducting tracks made of electroplated copper (Cu), Cu/Ni/Sn or silver (Ag) form second layer 312. In an exemplary embodiment, second layer 312 is made of elements such as copper, aluminum, silver, nickel, gold, and the like.

Second part 304 includes third layer 314 that is functionally similar to first layer 310. Third layer 314, which is an electrical insulator but a thermal conductor, is made of one of, but not limited to, ceramic, aluminum nitride, alumina, sapphire, silicon, and artificial diamond. Like first layer 310, third layer 314 can also be a metal-core printed circuit board. Second part 304 also includes fourth layer 316, which is a metallic interconnect with similar functionalities as second layer 312. Like second layer 312, fourth layer 316 is made of one of, but not limited to, copper, aluminum, tin, nickel, silver, and gold.

Second thermoelectric cooling device 400 includes one or more thermoelements, provided between first part 302 and second part 304. For the purpose of this particular description, the one or more thermoelements are indicated by second n-type thermoelement 402 and second p-type thermoelement 404. Second n-type thermoelement 402 comprises n-type thermoelectric films (films with electrons as majority carriers), whereas second p-type thermoelement 404 comprises p-type thermoelectric films (films with holes as majority carriers). Alternating the p-type and n-type thermoelements is desirable to ensure that both the thermoelements cool the first part 302 and reject the heat to the second part 304, while the thermoelements remain connected electrically in series.

Thermoelements 402 and 404 are attached to second layer 312 and fourth layer 316 through metal solders 318 and 320, respectively.

Second n-type thermoelement 402 and second p-type thermoelement 404 include metal substrate 102, barrier layers 114 and 202, and one or more thermoelectric films 112 (described in detail in conjunction with FIG. 2). In this exemplary embodiment, metal substrate 102 not only provides support to the thin thermoelectric films but also helps in the electrical as well as thermal conduction. In accordance with an embodiment, each thermoelement is coated with a solder on both ends. The materials that can be used in the metal substrates and the relative advantages of these materials have been described in conjunction with FIG. 3.

Second thermoelectric cooling device 400 can provide cooling densities close to 100 watts per square centimeter and heat rejection densities close to 400 watts per square centimeter. Further, the thermal losses due to ineffective spreading of heat are minimized by the high thermal conductivity of the metal substrates.

Figure 5:
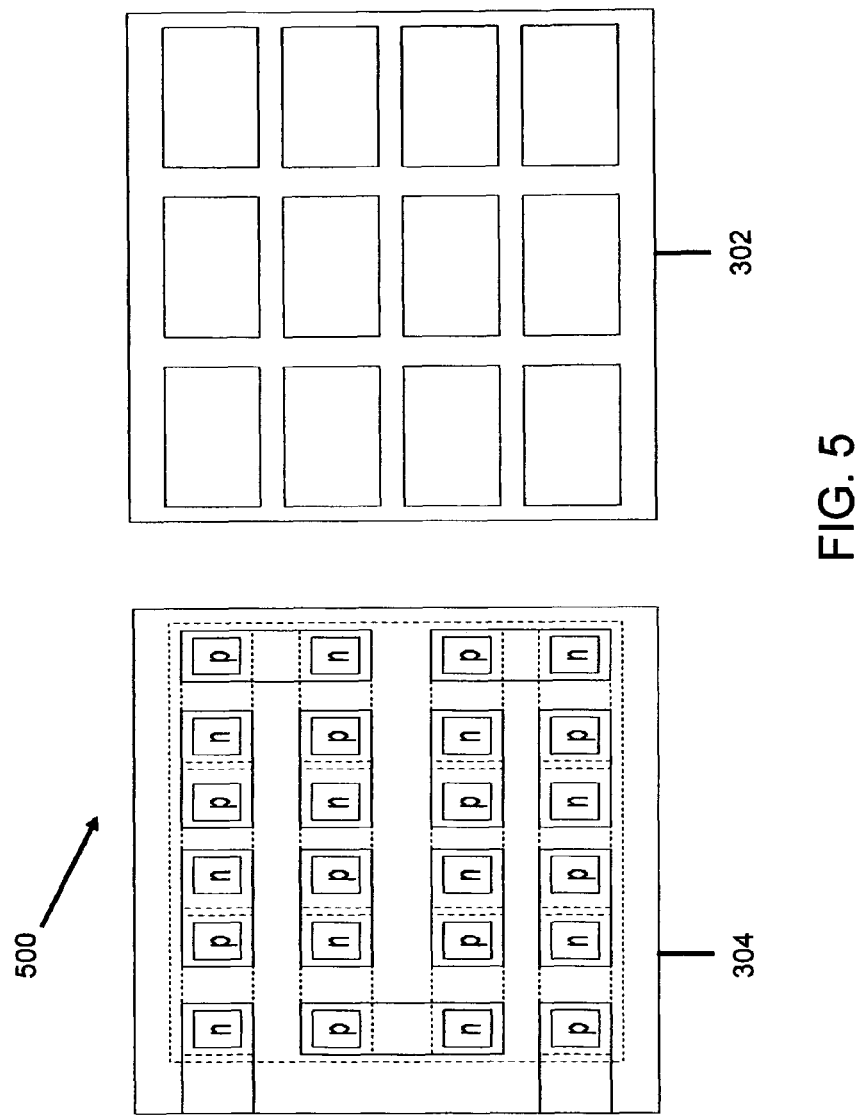
FIG. 5 illustrates a top view of a thermoelectric cooling device, in accordance with an embodiment of the present invention.

FIG. 5 illustrates a top view of thermoelectric cooling device 500, in accordance with an embodiment of the present invention.

Thermoelectric cooling device 500 includes first part 302, second part 304, and the thermoelements. First part 302 and second part 304 have been shown displaced to illustrate second part 304. The thermoelements are assembled in a particular order to enable the flow of current across thermoelectric cooling device 500. The arrangement illustrates alternate n-type and p-type thermoelements connected to second part 304. Both first part 302 and second part 304 comprise insulating substrates provided with metallic interconnects for the purpose of connecting the thermoelements. The majority of common bulk thermoelectric coolers that are available commercially have about 127 thermoelectric couples. Second part 304 can not only accommodate a similar number of thermoelectric couples, but, depending on the cooling requirements, it can be tailored to host any number of thermoelectric couples. While second part 304 provides a platform and bottom electrical connection for the purpose of connecting the thermoelements, first part 302 provides the top cover and electrical contacts.

Figure 6:
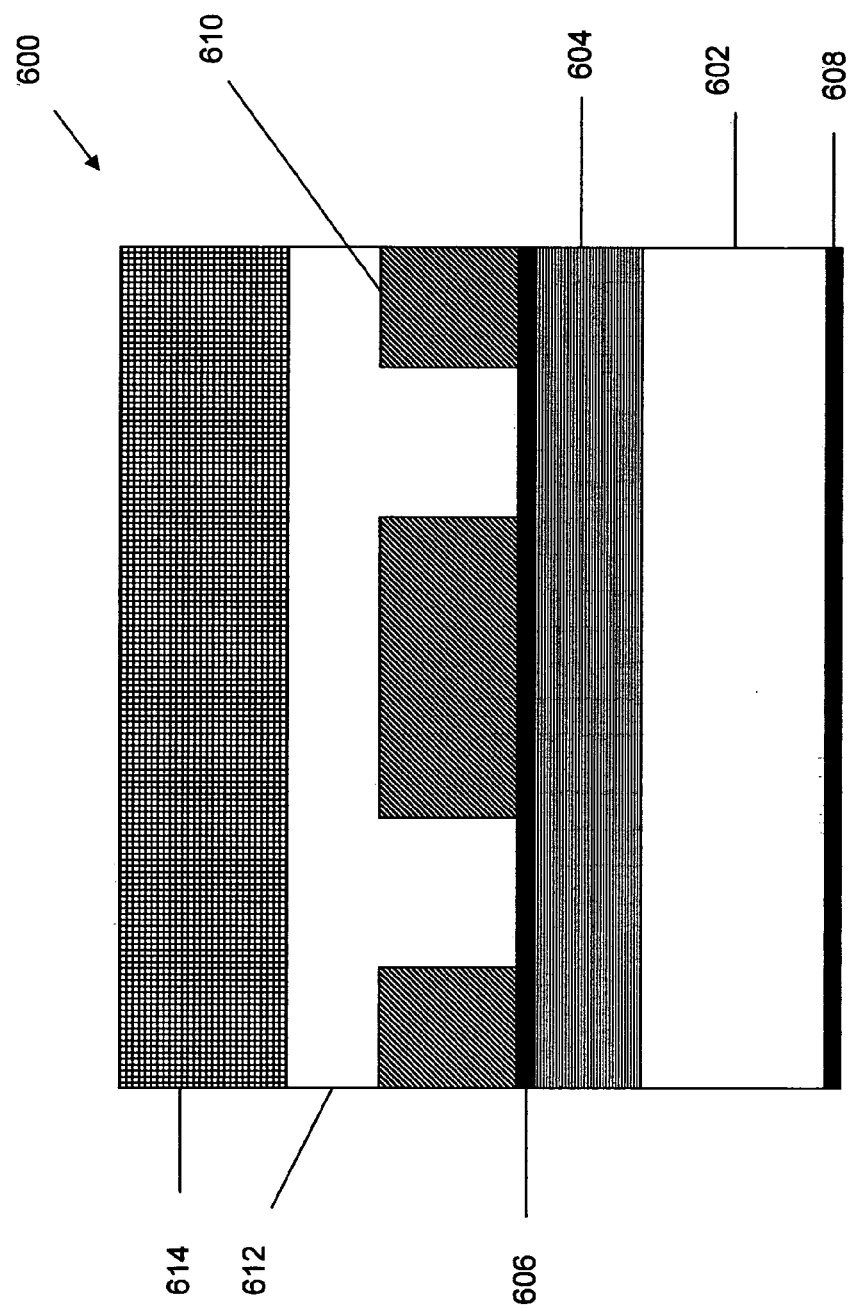
FIG. 6 illustrates a cross-sectional view of a flat core thermoelement, in accordance with yet another embodiment of the present invention.

FIG. 6 illustrates a cross-sectional view of a flat core thermoelement 600, in accordance with another embodiment of the present invention. Flat core thermoelement 600 includes a flat metal substrate 602, a flat thermoelectric film 604, a third barrier layer 606, a fourth barrier layer 608, a fifth layer 610, a sixth layer 612, and a seventh layer 614.

In accordance with an embodiment of the present invention, flat core thermoelement 600 includes flat metal substrate 602 to facilitate the dissipation of heat to a heat sink of flat core thermoelement 600. In an embodiment of the present invention, flat metal substrate 602 is made of molybdenum. In another embodiment, flat metal substrate 602 is made of aluminum, tungsten, nickel or copper. Use of materials such as aluminum in flat metal substrate 602 makes flat core thermoelement 600 cheaper than conventional thermoelements.

Graded thermoelectric material is deposited on flat metal substrate 602 to form flat thermoelectric film 604. Flat thermoelectric film 604 comprises either an n-type semiconductor material or a p-type semiconductor material having a thickness of less than 10 micrometer. Thermoelectric materials used for manufacturing flat thermoelectric film 604 are similar to the materials described in conjunction with FIG. 1. In an exemplary embodiment, flat core thermoelement 600 may include multiple thermoelectric films deposited over flat metal substrate 602, thereby forming a layered structure with an engineered Seebeck coefficient.

In accordance with an embodiment of the present invention, third barrier layer 606 is present on flat thermoelectric film 604. Third barrier layer 606 is a layer of barrier elements that include, but are not limited to, aluminum (Al), titanium tungsten (TiW), and nickel (Ni). Aluminum is provided in third barrier layer 606 to prevent diffusion of copper from sixth layer 612 into flat thermoelectric film 604. In another embodiment, third barrier layer 606 includes compounds such as TiW/Ni and TiW/Pt/Au.

Fifth layer 610 is a layer of polyimide with patterned grooves and has a thickness of about 10 micrometer. In an embodiment of the present invention, photo-definable polyimides, such as polyimide made by Hitachi-Dupont (HD) Microsystems, are used to manufacture flat core thermoelement 600. The polyimides used in the present invention are electrical dielectrics and good thermal insulators. In another embodiment of the present invention, fifth layer 610 is made of a material that includes titania, silica, or alumina deposited by sol-gel techniques.

Typically, sixth layer 612 is made of materials that include copper and nickel and is electroplated on fifth layer 610. Sixth layer 612 contacts the third barrier layer 606 through the gaps or vias in fifth layer 610. The thickness of sixth layer 612 is of the order of 5 micrometer. Seventh layer 614 is made of materials that include tin and indium and is electroplated on sixth layer 612. In an embodiment, the thickness of seventh layer 614 is about 10 micrometer.

Figure 7:
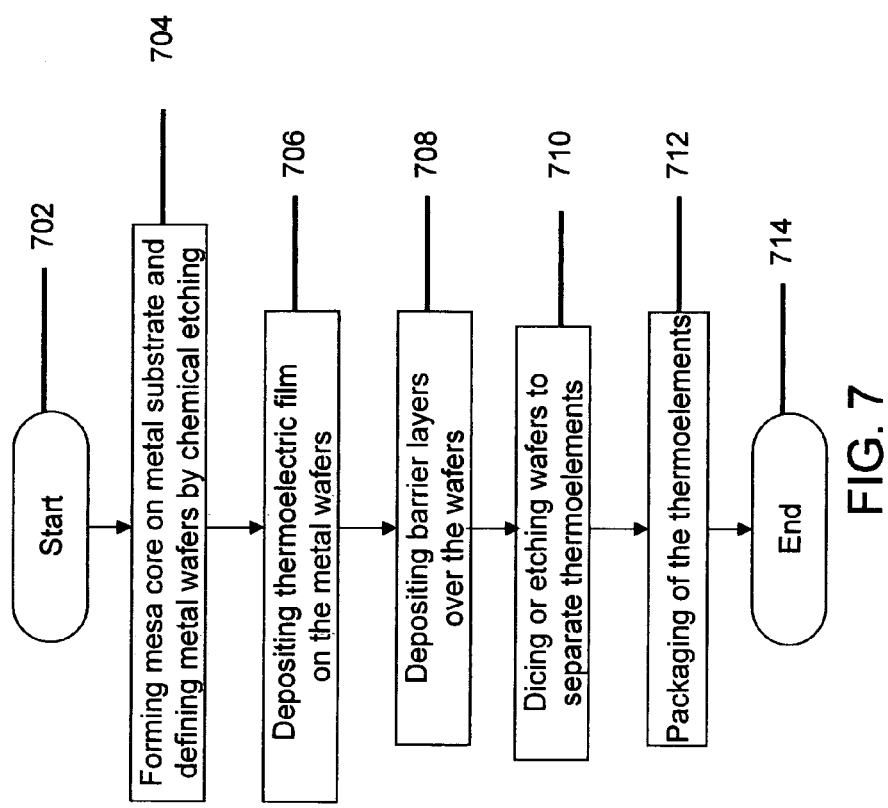
FIG. 7 is a flow chart illustrating a method for creating a thermoelectric cooling device, in accordance with an embodiment of the present invention.

FIG. 7 is a flow chart illustrating a method for creating a thermoelectric cooling device, in accordance with an embodiment of the present invention.

The method starts at step 702. At step 704, metal substrate 102, also herein referred to as a wafer, is formed by chemical etching of a metal sheet. In accordance with an embodiment, the metal sheet is cut to form metal substrate 102. In an embodiment, the cutting operation is done using lasers. Materials that are used for manufacturing metal substrate 102 have been described in conjunction with FIG. 1.

Since metal substrate 102 is exposed to high temperatures during the thermoelectric film deposition, anneal and solder reflow processes, it is important to take preventive steps in the beginning to remove possible stresses. At high temperatures, the residual stresses can warp the wafer, thereby creating problems due to non-uniformity in the subsequent process steps. The residual stresses in a substrate can be removed by annealing it to high temperatures while subjecting it to the pressure between two flat surfaces. After this tempering step, the metal substrate 102 undergoes a smoothing process. The top surface of metal substrate 102 can be smoothed by either Chemical Mechanical Planarization (CMP) polishing or single-point diamond turning. Since grown thermoelectric films have a rough topography, the smoothing of the substrate is desirable for thick thermoelectric films. Smoothing may not be necessary when the average surface roughness of the substrate is less than or equal to 0.1 micron. The formation of metal substrate 102 is described in detail in conjunction with FIG. 9.

Metal substrate 102 is etched to form grooves 108 and mesa cores 110. In an embodiment, chemical and photochemical etching is used to etch metal substrate 102. In an embodiment of the present invention, a metal sheet with length greater than 12 inches and width greater than 12 inches is etched to form metal substrate 102.

At step 706, thermoelectric film 112 is deposited on metal substrate 102. The deposition process is one of, but not limited to, plasma vapor deposition, e-beam sputtering, electroplating, molecular-beam epitaxy, sol-gel and metal-organic chemical vapor deposition. The thermoelectric materials used for manufacturing thermoelectric film 112 have been described in conjunction with FIG. 1. In various embodiments of the present invention, thermoelectric film 112 is deposited on one or more etched major surfaces of metal substrate 102. When two surfaces of metal substrate 102 are etched and subsequently deposited with thermoelectric film 112, the dual mesa core thermoelement described in conjunction with FIG. 1 is obtained. When only one surface of metal substrate 102 is etched and subsequently deposited with thermoelectric film 112, the thermoelement described in conjunction with FIG. 2 is obtained. A dual mesa core thermoelement is advantageous as it is symmetrical and is, therefore, easy to manufacture.

The performance of the films can be increased significantly by sequentially depositing different types of thin films such that the Seebeck coefficient is graded across the thermoelement. For n-type films, this can be achieved by depositing a YbAl3/Bi or Pb chalcogenide/YbAl3 sandwich. A similar gradation can be achieved in p-type films by controlling the diffusion of Pt across the thin film interfaces. Since an ideal thermoelectric film should have an electron-lattice phonon-glass structure, phonon blocking layers, for example, layers made of indium, can further improve the performance of the films mentioned above. Since the deposited thermoelectric films tend to form clusters and large grains, such films can be homogenized by rapid quenching during the anneal cycle. By directly depositing the films on metal substrates and avoiding complicated chemical etching steps, all the techniques mentioned above can be implemented to create thermoelectric devices. Multiple thermoelectric layers can be provided to reduce the thermal conductivity of the thermoelement and provide a smooth gradient for a change in the Seebeck coefficient at the interfaces.

At step 708, barrier layers are deposited over the wafers. After the thermoelectric film deposition, first barrier layer 114 is coated on thermoelectric film 112. First barrier layer 114 prevents the oxidation of thermoelectric film 112 and is preferably deposited along with the thermoelectric film without breaking the vacuum. First barrier layer 114 also prevents the thermal diffusion of the solder material into thermoelectric film 112 during the soldering process or over a long period of time. In an embodiment of the present invention, second barrier layer 202 is deposited on second surface 106 of metal substrate 102. The materials used for first barrier layer 114 and second barrier layer 202 have been described in conjunction with FIG. 1 and FIG. 2 respectively.

In an embodiment of the present invention, thermoelectric film 112 is subjected to annealing to homogenize its Seebeck, electrical and thermal properties. Annealing the film with a capping layer on the top inhibits grain growth during the annealing process, thereby keeping the film topography smooth. The deposition of thermoelectric film 112 on metal substrate 102 has been described in detail in conjunction with FIG. 10.

At step 710 wafers are diced or etched to separate thermoelements. After depositing thermoelectric film 112 on metal substrate 102 and depositing first barrier layer 114, the wafer is diced to form first thermoelement 100. Similarly, second thermoelement 200 is formed when the wafer is diced after second barrier layer 202 is deposited on second surface 106 of metal substrate 102. In an embodiment of the present invention, a typical thermoelement is a square of sides slightly less than one millimeter and contains four to sixteen mesa cores.

If required, thermoelements 100 and 200 may be processed further after dicing. Dicing soft metal substrates such as Cu and Al with a diamond saw creates a burr along the dicing edges. This deformation (or burr) is absent in the refractory metal substrates such as W and Mo. For soft metals, such as aluminum and copper, the carbon dioxide laser cutting provides a desired surface finish with the minimum burr height and precise quality of the cut. Another alternative can be dicing with water jets where the material is cut without interfering with its internal structure, since there is no heat affected zone.

In addition to the above, a suitable choice of diamond saw and saw speeds can reduce the burr height, and the substrate can be engineered in a way such that this small burr does not affect the performance of thermoelements 100 and 200. One such method involves mechanically cutting grooves (about 100 micron deep) and removing the burr through polishing, by using either the CMP or diamond turning processes. Laser cutting along the grooves creates a burr that is sub-terrain and does not interfere with the packaging process.

In accordance with another embodiment, the grooves can be created by chemical etching. After patterning metal substrate 102 with a photoresist layer, it can be subjected to standard metal etchants. Various examples of standard metal etchants include, but are not limited to, phosphoric acid, hydrochloric acid, nitric acid and acetic acid for etching aluminum. Some other examples of standard metal etchants include sulphuric acid, ferric chloride and nitric acid for etching copper. The burr can be removed post-dicing when the wafer is diced with a layer of photoresist and individual dies are exposed to etching chemicals.

Step 712 involves packaging of the diced thermoelements. As shown in thermoelectric cooling device 500, n-type thermoelements and p-type thermoelements are provided between first part 302 and second part 304. Since both the ends of the thermoelements are either solder plated or can be soldered, the thermoelements can be joined to first part 302 and second part 304 by reflowing in a vacuum reflow oven. When two different solders are used, the thermoelements can be assembled on one plate (for example, first part 302) with the solder that melts at a high temperature, followed by attaching the second plate (for example, second part 304) with a low melting solder. Top view of a fully packaged device is shown in FIG. 5. The process ends at step 714.

Figure 8:
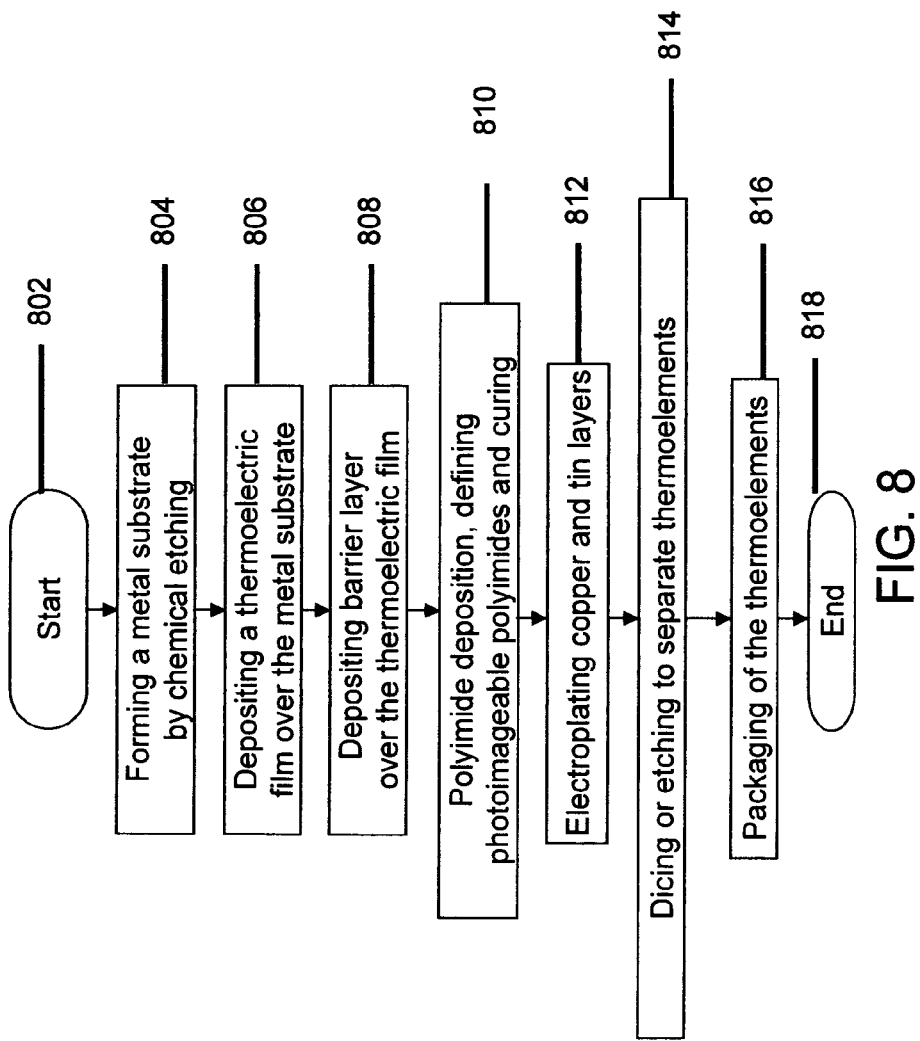
FIG. 8 is a flow chart illustrating a method for creating a flat core thermoelement, in accordance with another embodiment of the present invention.

FIG. 8 is a flow chart illustrating a method for creating flat core thermoelement 600, in accordance with another embodiment of the present invention.

The method starts at step 802. At step 804, flat metal substrate 602, also herein referred to as a wafer, is formed by chemical etching. In accordance with an embodiment, a metal sheet is cut to form flat metal substrate 602 using lasers. The materials used for manufacturing flat metal substrate 602 have been described in conjunction with FIG. 6.

In an embodiment of the present invention, the residual stresses in flat metal substrate 602 are removed by annealing it to high temperatures while subjecting it to the pressure between two flat surfaces. After this tempering step, the flat metal substrate 602 undergoes a smoothing process. The top surface of flat metal substrate 602 is smoothed by either Chemical Mechanical Planarization (CMP) polishing or single-point diamond turning. Since grown thermoelectric films have a rough topography, the smoothing of the substrate is desirable for thick thermoelectric films. Smoothing may not be necessary when the average surface roughness of the substrate is less than or equal to 0.1 micron. The formation of metal substrate 102 is described in detail in conjunction with FIG. 9.

At step 806, flat thermoelectric film 604 is deposited over flat metal substrate 602. The deposition process is one of, but not limited to, plasma vapor deposition, e-beam sputtering, electroplating, molecular-beam epitaxy, sol-gel and metal-organic chemical vapor deposition. The thermoelectric materials for thermoelectric film 112 described in conjunction with FIG. 1 are used for manufacturing flat thermoelectric film 604.

The performance of the films can be increased significantly by sequentially depositing different types of thin films such that the Seebeck coefficient is graded across the thermoelement. For n-type films, this can be achieved by depositing a YbAl3Bi or Pb chalcogenide/YbAl3 sandwich. A similar gradation can be achieved in p-type films by controlling the diffusion of Pt across the thin film interfaces. Since an ideal thermoelectric film should have an electron-lattice phonon-glass structure, phonon blocking layers, for example, layers made of indium, can further improve the performance of the films mentioned above. Since the deposited thermoelectric films tend to form clusters and large grains, such films can be homogenized by rapid quenching during the anneal cycle. By directly depositing the films on metal substrates and avoiding complicated chemical etching steps, all the techniques mentioned above can be implemented to create cooling devices. Multiple thermoelectric layers can be provided to reduce the thermal conductivity of the thermoelement and provide a smooth gradient for a change in the Seebeck coefficient at the interfaces.

After the thermoelectric film deposition, flat metal substrate 602 has flat thermoelectric film 604 on one surface. At step 808, third barrier layer 606 is deposited over flat thermoelectric film 604. Third barrier layer 606, preferably deposited along with the thermoelectric film (without breaking the vacuum), prevents the oxidation of flat thermoelectric film 604. Third barrier layer 606 also prevents the thermal diffusion of the materials into flat thermoelectric film 604 over a long period of time. Fourth barrier layer 608 is deposited on a surface of flat metal substrate 602 that does not have flat thermoelectric film 604.

After depositing barrier layers 606 and 608, flat thermoelectric film 604 is subjected to annealing to homogenize its Seebeck, electrical and thermal properties. Annealing the film with a capping layer on the top inhibits grain growth during the annealing process, thereby keeping the film topography smooth. The method of deposition of flat thermoelectric film 604 on flat metal substrate 602 has been described in detail in conjunction with FIG. 10. Flat core thermoelement 600 is processed using techniques mentioned in conjunction with FIG. 7.

At step 810, photo-definable polyimide is spin-coated over third barrier layer 606 and then the polyimide is cured using ultraviolet light. In an embodiment of the present invention, polyimide deposition is done using methods such as injection of the polyimide. The regions of polyimide exposed to ultraviolet light become cross linked and the unexposed regions are removed by dissolving them in organic solvents. A patterned polyimide layer is obtained in this manner. This results in the formation of fifth layer 610 that is made of polyimide and has grooves in it.

At step 812, copper and tin layers are electroplated on the metal wafer. Copper is electroplated on fifth layer 610 to form sixth layer 612. On the layer of copper, a layer of tin is electroplated to form seventh layer 614. The wafer is then diced at step 814 to obtain flat core thermoelement 600. In another embodiment of the present invention, material such as titania, silica, or alumina are used in place of polyimide in fifth layer 610. These are very low thermally and electrically conducting dielectrics produced by sol-gel processes. Step 816 involves packaging of the diced thermoelements. The process ends at step 818.

Figure 9:
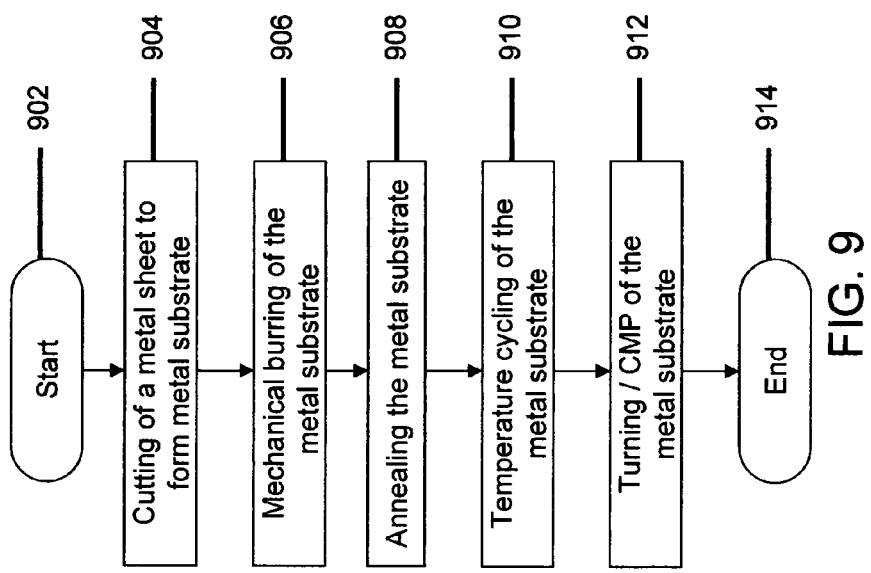
FIG. 9 is a flow chart illustrating a method for creating a metal substrate, in accordance with an embodiment of the present invention.

FIG. 9 is a flow chart illustrating a method for creating metal substrate 102, in accordance with an embodiment of the present invention.

The method starts at step 902. At step 904, a metal sheet is cut using a laser. In an embodiment of the present invention, the metal sheet is square with a length equal to 12 inches and a thickness equal to 200 micrometer. Other sized metal sheets can be used as long as they provide sufficient stiffness. Thin metal substrates produce a small amount of burrs during dicing and have a distinct advantage in laser cutting. In an exemplary embodiment, the metal sheet is made of, but is not limited to, aluminum, copper, tungsten, and molybdenum.

At step 906, metal substrate 102 undergoes mechanical burring around the edges to remove the burr created during laser cutting. Since these substrates are cut from metals with a standard-rolled surface, also known as mill finish, they have an average roughness typically in the order of a few microns. The metal substrate may be cut into wafer shapes with its flats determined by the Semiconductor Equipment and Materials International (SEMI) standards and may be further smoothened by polishing it to a 32 rms finish (about 1 micron surface roughness).

Metal substrate 102 undergoes annealing at step 908 and temperature cycling at step 910 to remove the residual stresses. In accordance with an embodiment, the temperature during annealing of an aluminum substrate in the presence of vacuum is in the range of 350 to 400 degrees centigrade. During annealing, metal substrate 102 is pressed at pressures in the range of one to four kilopascals between two flat surfaces, which pressures prohibit grain growth in the vertical direction. After two to three hours of annealing at high temperature, the substrate is slowly ramped down to room temperature. This cycle can be repeated more than once to orient the grains in the substrate and remove all the residual stresses. This tempering process prevents warping or bending of the substrates in the later stages of the process.

At step 912, metal substrate 102 undergoes a processing step to smooth the surface in the preparation of the thin film deposition. In accordance with one embodiment, the smoothing step can be a turning process such as a diamond-turning process. Alternative polishing techniques, such as rubbing the metal surface with fine abrasives, followed by buffing to produce a mirror-finished surface can also be used. In accordance with another embodiment involving copper and tungsten substrates, smoothing can be performed by the CMP process. CMP, a well-established technique in semiconductor fabrication, uses abrasive chemical slurry in conjunction with a polishing pad to create smooth metal surfaces. The method ends at step 914.

Figure 10:
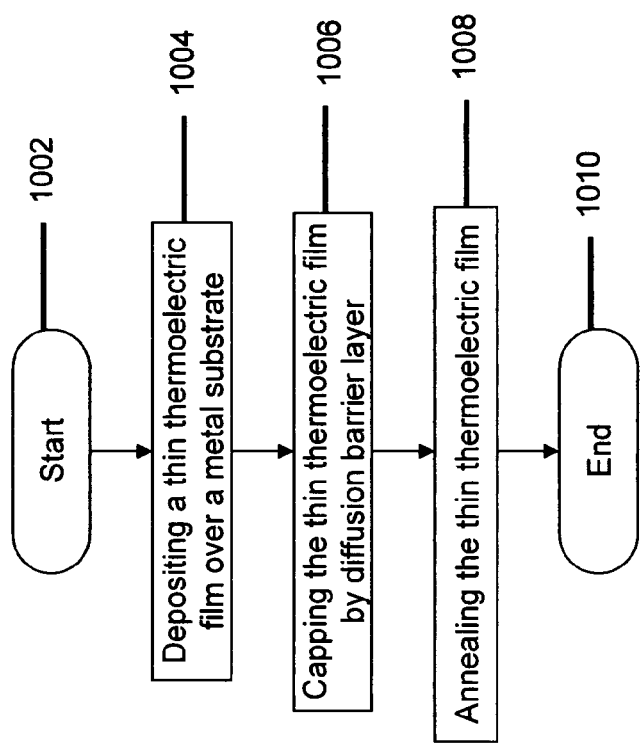
FIG. 10 is a flow chart illustrating a method for depositing a thermoelectric film on a metal substrate, in accordance with an embodiment of the present invention.

FIG. 10 is a flow chart illustrating a method for depositing thermoelectric film 112 (which is preferably a thin thermoelectric film) on metal substrate 102, in accordance with various embodiments of the present invention.

The method starts at step 1002. At step 1004, thermoelectric film 112 is deposited over metal substrate 102, which may have a thin refractory metal layer at the surface for adhesion if the underlying metal is not a refractory element such as Mo, W, or Nb. The adhesive layer and the thin film can be sequentially deposited in-situ in the same deposition chamber, thereby creating a clean interface between the film and the substrate. The deposition process is one of, but is not limited to, plasma vapor deposition, e-beam sputtering, electroplating, molecular-beam epitaxy, sol-gel and metal-organic chemical vapor deposition. While molecular beam epitaxy has been used to deposit high-quality super-lattice films, the main drawback of this technique is its slow throughput and high installation cost in commercial applications. Alternatively, sputtering and electroplating are the two techniques where large substrates can be covered at a very high throughput.

There is a distinct advantage relating to the performance of the thermoelectric device when different types of thermoelectric films are layered together. In an embodiment of the present invention, thermoelectric materials of a p-type layered structure include, but are not limited to, $Zn_4Sb_3$, $Ag_{0.5}Pb_6Sn_2Sb_{0.2}Te_{10}$, $MnSi_{1.73}$, $NaCo_2O_4$, Bi0.5Sb1.5Te3/Al/KBiTe3, Bi0.5Sb1.5Te3/Al/Bi0.5Sb1.5Te3, Pt/Bi(0.5)Sb(1.5)Te(3)/Pt, and the like. Similarly, novel n-type layered thermoelectric structures include, but are not limited to, $Mg_2Si_{0.4}Sn_{0.6}$, $AgPb_{18}SbTe_{20}$, YbAl3Bi2Te3NbAl3, Bi2Se(0.3)Te(2.7)/Al/ Bi2Se(0.3)Te(2.7), Bi2Te3/Al/PbTe, InSb/Al/Bi2Te3, and the like. Multiple thermoelectric layers can reduce the thermal conductivity of the thermoelement and provide a smooth gradient for a change in the Seebeck coefficient at the interfaces. In an exemplary embodiment, a single 0.5 micron layer of p-type thermoelectric film Bi(0.5)Sb(1.5)Te(3) sputter deposited on a thin TiW at 290° C. and 5 mTorr pressure exhibits a Seebeck coefficient of 240 microVolt./K and an electrical conductivity of 0.05 siemens/micrometer. Similar thickness of an n-type thermoelectric film Bi(2)Te(3) sputter coated on thin TiW at 330° C. and 20 mTorr pressure exhibits a Seebeck coefficient of −200 microVolt/K and an electrical conductivity of 0.07 siemens/micrometer.

In an exemplary embodiment, the thin thermoelectric film is a bismuth chalcogenide, whose typical examples include, but are not limited to, Bi0.5Sb1.5Te3, Bi2Te3, Bi2Se3, and KBiTe3. In another exemplary embodiment, the thin thermoelectric film is a lead chalcogenide, whose examples include, but are not limited to, PbTe, PbEuTe and PbSnTe. Other materials of thin films that can be deposited include YbAl3, CeAl3, InSb, SiGe, HgCdTe, and Skutteridites which further include, but are not limited to, CoSb3, and Fe0.2Cu0.8Sb3. Recently, silicon nano-wires, which can also be incorporated in metal substrates, have shown good thermoelectric properties.

At step 1006, a thin capping layer is deposited on thermoelectric film 112 to prevent oxidation of the film surface. The capping layer can be one of, but is not limited to, metals such as Pt, Al, Ni, Ti and chromium (Cr). At step 1008, thermoelectric film 112 is subjected to annealing in vacuum or an inert atmosphere. In accordance with an embodiment, the annealing temperature is in the range of 300 to 350° C., and the anneal time is typically between two and three hours. Annealing improves the Seebeck coefficient and the electrical conductivity of the thermoelectric film. Further, annealing creates smaller and homogeneous grains in the presence of a capping layer. The method ends at step 1010.

What is claimed is:

1. A p-type or n-type thermoelement for use in thermoelectric devices, the thermoelement comprising:
    a metal substrate comprising a first surface and a second surface, at least one of the first surface and the second surface comprising one or more grooved portions and one or more flat portions, wherein the one or more flat portions have a cross-section area that defines the electrical and thermal resistance of the thermoelement, and the one or more grooved portions have the form of a circular arc having a radius of about 100 micrometers; and
    one or more thermoelectric films, wherein at least one of the one or more thermoelectric films is provided on the metal substrate, wherein both the first surface and the second surface of the metal substrate comprise the one or more grooved portions and the one or more thermoelectric films, wherein the metal substrate is disposed between the one or more thermoelectric films of the first surface and the one or more thermoelectric films of the second surface such that the one or more thermoelectric films directly conform to the first surface and second surface, respectively.

2. The thermoelement of claim 1 further comprising a layer of thermal diffusion barrier elements present on the one or more thin thermoelectric films.

3. The thermoelement of claim 1, wherein at least one of the one or more thermoelectric films is a p-type thermoelectric film.

4. The thermoelement of claim 3, wherein the p-type thermoelectric film comprises one or more of $Bi_2Te_3$—$Sb_2Te_3$ pseudo-ternary systems, $Zn_4Sb_3$, $Ag_{0.5}Pb_6Sn_2Sb_{0.2}Te_{10}$, $MnSi_{1.73}$, and $NaCo_2O_4$.

5. The thermoelement of claim 1, wherein at least one of the one or more thermoelectric films is an n-type thermoelectric film.

6. The thermoelement of claim 5, wherein the n-type thermoelectric film comprises one or more of $Bi_2Te_3$—$Sb_2Te_3$ pseudo-ternary systems, lead telluride (PbTe), $AgPb_{18}SbTe_{20}$, indium antimonide (InSb), gallium indium antimonide (GaInSb), indium arsenide (InAs), cobalt antimonide ($CoSb_3$), nickel antimonide ($NiSb_3$), iron antimonide ($FeSb_3$), ytterbium aluminide ($YbAl_3$), and magnesium silicide.

7. The thermoelement of claim 1, wherein the first surface of the metal substrate comprises the one or more thermoelectric films and the second surface of the metal substrate comprises a layer of thermal diffusion barrier elements.

8. A thermoelectric device comprising:
    a plurality of p-type or n-type thermoelements, the thermoelements comprising:
    a metal substrate comprising a first surface and a second surface, at least one of the first surface and the second surface comprising one or more grooved portions and one or more flat portions, wherein the one or more flat portions have a cross-section area that defines the electrical and thermal resistance of the thermoelements, and the one or more grooved portions have the form of a circular arc having a radius of about 100 micrometers; and
    one or more thermoelectric films, wherein at least one of the one or more thermoelectric films is provided on the metal substrate, wherein both the first surface and the second surface of the metal substrate comprise the one or more grooved portions and the one or more thermoelectric films, wherein the metal substrate is disposed between the one or more thermoelectric films of the first surface and the one or more thermoelectric films of the second surface such that the one or more thermoelectric films directly conform to the first surface and the second surface, respectively;
    one or more metallic interconnects connected with the thermoelements; and
    one or more layers made of thermally conducting but electrically insulating material connected with the one or more metal interconnects.

9. The thermoelectric device of claim 8, wherein the one or more metallic interconnects are connected with the thermoelements through metal solders.

10. The thermoelectric device of claim 8, wherein the thermoelements comprise one or more p-type thermoelements and one or more n-type thermoelements.

11. The thermoelement of claim 2, wherein the thermal diffusion barrier layer comprises at least one of: i) aluminum, ii) titanium tungsten, iii) nickel, iv) gold, v) a titanium tungsten and nickel compound, and vi) a titanium tungsten and platinum and gold compound.

* * * * *